(12) United States Patent
Darrer (10) Patent No.: US 12,275,636 B2
(45) Date of Patent: Apr. 15, 2025

(54) METHOD FOR DETERMINING A TORSION ANGLE OF A MIRROR BODY OF AN MEMS APPARATUS

(71) Applicant: Infineon Technologies AG, Neubiberg (DE)

(72) Inventor: Franz Michael Darrer, Graz (AT)

(73) Assignee: Infineon Technologies AG, Neubiberg (DE)

( * ) Notice: Subject to any disclaimer, the term of this patent is extended or adjusted under 35 U.S.C. 154(b) by 938 days.

(21) Appl. No.: 17/443,122

(22) Filed: Jul. 21, 2021

(65) Prior Publication Data
US 2022/0043254 A1 Feb. 10, 2022

(30) Foreign Application Priority Data
Aug. 7, 2020 (DE) .......................... 102020120906.1

(51) Int. Cl.
| | |
|---|---|
| H02K 33/00 | (2006.01) |
| B81B 7/00 | (2006.01) |
| B81B 7/02 | (2006.01) |
| H02N 1/00 | (2006.01) |
| H02P 1/00 | (2006.01) |
| H02P 3/00 | (2006.01) |
| H02P 5/00 | (2016.01) |
| G02B 26/08 | (2006.01) |
| G05B 11/01 | (2006.01) |
| G09G 3/02 | (2006.01) |

(52) U.S. Cl.
CPC ................ *B81B 7/02* (2013.01); *B81B 7/008* (2013.01); *H02N 1/008* (2013.01); *G02B 26/085* (2013.01); *G05B 11/01* (2013.01); *G05B 2219/41344* (2013.01); *G09G 3/025* (2013.01)

(58) Field of Classification Search
CPC ............ B81B 7/02; B81B 7/008; H02N 1/008
USPC ........................................................ 318/119
See application file for complete search history.

(56) References Cited

U.S. PATENT DOCUMENTS

| | | | |
|---|---|---|---|
| 6,717,325 B2 | 4/2004 | Fernandez et al. | |
| 7,302,111 B2 | 11/2007 | Olsson et al. | |
| 7,466,474 B2 | 12/2008 | Jung et al. | |
| 8,179,583 B2 | 5/2012 | Yoda | |
| 9,983,403 B2 | 5/2018 | Graves | |
| 10,018,723 B2 | 7/2018 | Sromin et al. | |
| 2001/0040419 A1* | 11/2001 | Behin | G02B 6/359 |
| | | | 310/309 |
| 2003/0066351 A1 | 4/2003 | Weinberg et al. | |
| 2004/0099739 A1* | 5/2004 | Kuo | G02B 6/359 |
| | | | 235/454 |
| 2005/0091006 A1 | 4/2005 | Rober | |
| 2005/0231065 A1 | 10/2005 | Fu | |

(Continued)

FOREIGN PATENT DOCUMENTS

| | | |
|---|---|---|
| CN | 1585908 A | 2/2005 |
| CN | 1647356 A | 7/2005 |

(Continued)

*Primary Examiner* — Erick D Glass
(74) *Attorney, Agent, or Firm* — Harrity & Harrity, LLP (57) ABSTRACT

A method comprises applying a driver voltage to an electrostatic comb drive of an MEMS apparatus and overlaying the driver voltage with a periodic voltage signal. The method further comprises determining a torsion angle of a mirror body of the MEMS apparatus based on the periodic voltage signal.

21 Claims, 5 Drawing Sheets

(56) References Cited

U.S. PATENT DOCUMENTS

| | | | |
|---|---|---|---|
| 2006/0023293 A1 | 2/2006 | Fu | |
| 2009/0153932 A1 | 6/2009 | Davis et al. | |
| 2014/0320943 A1 | 10/2014 | Oyama et al. | |
| 2015/0041629 A1 | 2/2015 | Graves et al. | |
| 2015/0204650 A1 | 7/2015 | Erlich | |
| 2021/0116701 A1* | 4/2021 | Lee | G02B 26/0841 |
| 2022/0187590 A1* | 6/2022 | Brunner | G02B 26/0858 |
| 2022/0324698 A1* | 10/2022 | Loya | B81B 3/0083 |

FOREIGN PATENT DOCUMENTS

| | | |
|---|---|---|
| CN | 101284642 A | 10/2008 |
| CN | 101950080 A | 1/2011 |
| CN | 104520750 A | 4/2015 |
| CN | 106796347 A | 5/2017 |
| DE | 102008012825 A1 | 10/2008 |
| DE | 102014207663 A1 | 10/2014 |
| KR | 20080106740 A | 12/2008 |

\* cited by examiner

METHOD FOR DETERMINING A TORSION ANGLE OF A MIRROR BODY OF AN MEMS APPARATUS

CROSS REFERENCE TO RELATED APPLICATION

This application claims priority to German Patent Application No. 102020120906.1 filed on Aug. 7, 2020, the content of which is incorporated by reference herein in its entirety.

TECHNICAL FIELD

The present disclosure relates to methods for determining a torsion angle of a mirror body of an MEMS apparatus. Furthermore, the disclosure relates to MEMS apparatuses that can be operated by such methods.

BACKGROUND

MEMS (micro-electromechanical system) apparatuses can be for example LIDAR (Light Detection and Ranging) scanning apparatuses, as may be employed in fully autonomous or semiautonomous self-driving automobiles. Mirror bodies having controllable torsion angles can be used in such apparatuses in order to be able to reflect light in different directions. The torsion angle of the mirror body can be dependent on a voltage applied to an electrostatic comb drive. For adequate operation of the MEMS apparatus, it should be ensured that the mirror body is actually deflected through the torsion angle set by way of the voltage.

SUMMARY

Various aspects relate to a method. The method comprises applying a driver voltage to an electrostatic comb drive of an MEMS apparatus. The method further comprises overlaying the driver voltage with a periodic voltage signal. The method further comprises determining a torsion angle of a mirror body of the MEMS apparatus based on the periodic voltage signal.

Various aspects relate to an MEMS apparatus. The MEMS apparatus comprises a mirror body and one or more electrostatic comb drives for twisting the mirror body based on one or more driver voltages. The MEMS apparatus further comprises a unit for overlaying the one or more driver voltages with one or more periodic voltage signals. The MEMS apparatus further comprises a unit for determining a torsion angle of the mirror body based on the one or more periodic voltage signals.

BRIEF DESCRIPTION OF THE DRAWINGS

Methods and apparatuses according to the disclosure are explained in more detail below with reference to drawings. The elements shown in the drawings are not necessarily reproduced to scale relative to one another. Identical reference signs can denote identical components.

DETAILED DESCRIPTION

The figures described below show MEMS apparatuses and methods for operating such MEMS apparatuses. The apparatuses and methods described can be depicted in a general manner in order to qualitatively describe aspects of the disclosure. The apparatuses and methods described can have further aspects that cannot be depicted in the respective figure for the sake of simplicity. However, the respective example can be extended by aspects that are described in conjunction with other examples according to the disclosure. Implementations relating to a specific figure can therefore apply equally to implementations in other figures.

Figure 1:
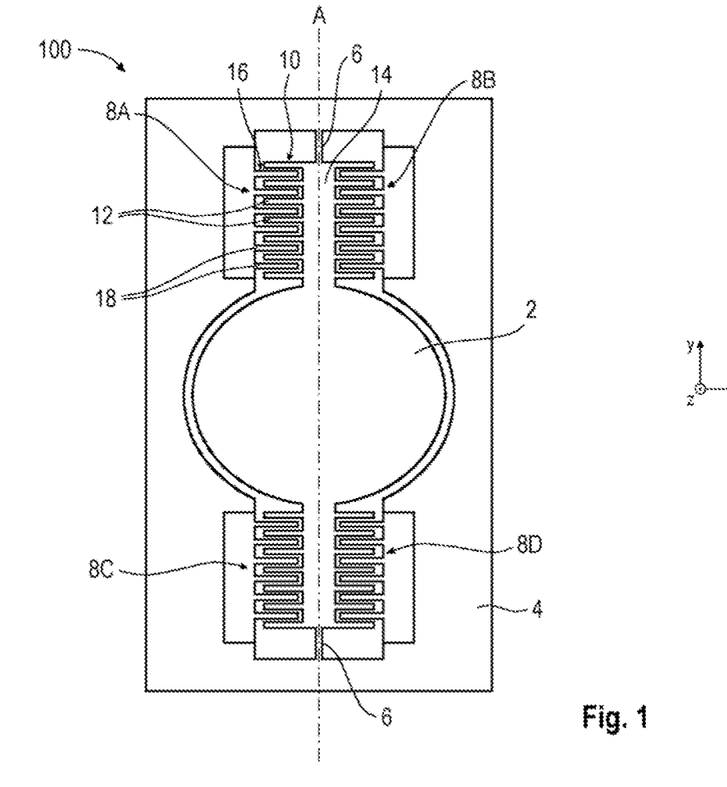
FIG. 1 shows a schematic plan view of an MEMS apparatus according to the disclosure.

The MEMS apparatus 100 of FIG. 1 can have a mirror body (or scanner body) 2, a frame 4 (e.g., a rigid frame), and suspension structures 6. The mirror body 2 can be configured to rotate about a swivel axis or rotation axis A. The two opposite suspension structures 6 can mechanically connect the mirror body 2 to the frame 4. By way of example, each of the suspension structures 6 can have a spring element in the form of a torsion rod, the suspension structures 6 not being restricted to a specific illustrative implementation of this kind, however. The suspension structures 6, or the spring elements, can run substantially parallel to the swivel axis A of the mirror body 2, or can define such a swivel axis.

During operation of the MEMS apparatus 100, the mirror body 2 can be driven, as a result of which it oscillates about the swivel axis A. Light reflected by the mirror body 2 can therefore oscillate back and forth and be used for scanning the surroundings, for example. In some implementations, the light reflected by the mirror body 2 can be provided by a laser source (not shown). The MEMS apparatus 100 can be a LIDAR scanning apparatus, for example, as may be employed in fully autonomous or semiautonomous self-driving automobiles, for example.

The MEMS apparatus 100 can have a drive for driving the mirror body 2. Such a drive can be implemented by one or more electrostatic comb drives 8A to 8D, which can be arranged with the mirror body 2. Each of the comb drives 8A to 8D can have first drive structures, e.g. comb structures having first comb electrodes, for the mirror body 2 and second drive structures, e.g. comb structures having second comb electrodes, for the frame 4. Drive signals, in particular periodically varying drive voltages, can be applied to the drive in order to cause the mirror body 2 to oscillate about the swivel axis A.

In some implementations, as shown in FIG. 1, the MEMS apparatus 100 can have, by way of illustration, four comb drives 8A to 8D, which can be arranged to the left and right of the swivel axis A. Two of the comb drives 8 in each case can be opposite one another and can be arranged symmetrically with respect to the swivel axis A. Each of the comb drives 8A to 8D can have in each case a first comb structure 10 having a multiplicity of comb fingers 12, which, in the implementation shown in FIG. 1, can start out from a section 14 running along the swivel axis A and can run substantially parallel to one another. In addition, each of the comb drives 8A to 8D can have in each case a second comb structure 16 having a multiplicity of comb fingers 18, which, in the implementation shown in FIG. 1, can start out from the frame 4 and can likewise run substantially parallel to one another. In some implementations, each of the comb structures 10 and 16 can have up to approximately one hundred or more comb fingers 12 and 18.

The comb drives 8A to 8D can be used for electrostatic control and for driving of the MEMS apparatus 100, or of the mirror body 2. Each of the comb drives 8A to 8D can have in each case the two (e.g., interdigital) comb structures 10 and 16. The first comb structure 10 mounted on the section 14 of the mirror body 2 can be referred to as a "rotor". Accordingly, the comb fingers 12 of the first comb structure 10 can be referred to as rotor comb fingers. The second comb structure 16, or its comb fingers 18, mounted on the frame 4 can be referred to as a "stator", or stator comb fingers. The rotor comb fingers 12 and the stator comb fingers 18 can be arranged offset with respect to one another such that they intermesh and enable an oscillation about the swivel axis A.

The stator and rotor of each of the comb drives 8A to 8D can form electrodes of a capacitor. A (e.g., resonant) MEMS scanning apparatus 100 can be interpreted as a resonantly excited mass-spring-damper system. By applying an AC voltage U to the comb driver capacitor, e.g. between the rotor and the stator, it is possible to feed energy into this mass-spring-damper system. The voltage U can be in particular a unipolar AC voltage U having approximately double the mechanical natural resonant frequency of the MEMS scanning apparatus. The oscillator can be driven to resonance by the applied AC voltage. In some implementations, the energy $\frac{1}{2} C U^2$ stored in the capacitor with a capacitance C can be coupled into the kinetic energy of the oscillator twice per oscillation cycle.

Besides resonantly operated MEMS scanning apparatuses, there are also quasi-statically operated MEMS scanning apparatuses 100 comprising an electrostatic comb drive. In the case of the latter apparatuses, by applying a voltage U to the comb structure on one side relative to the swivel axis A, e.g. the right-hand side, it is possible to exert a torque on the mirror body 2. As a result, the mirror body 2 can deflect as far as an angle at which the restoring torque generated by the spring elements 6 is equal to the electrostatically generated torque. If the voltage U is applied to the comb structure on the other side relative to the swivel axis, the mirror body 2 deflects in the opposite direction. This operation requires a topology of stator and rotor fingers in which, in the rest position, the electrostatically generated torque does not vanish or is high enough. In some implementations, the rate at which the voltage U is changed in order to scan different angles may be low enough so as to avoid resonant excitation of the mass-spring-damper system. In some implementations, the rate of change of U can be significantly less than the resonant frequency of the mass-spring-damper system. In some implementations, given a suitable control technique, the rotor can be accelerated to the maximum and then actively slowed as a result of suitable time characteristics of the voltage U.

Figure 2:
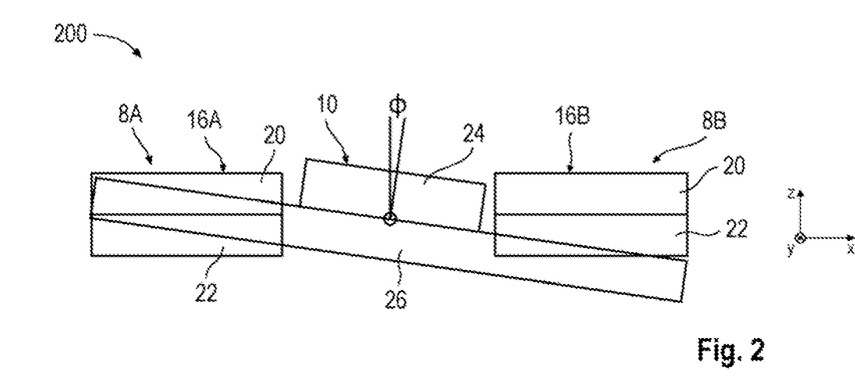
FIG. 2 shows a schematic cross-sectional side view of an MEMS apparatus according to the disclosure.

FIG. 2 shows a schematic cross-sectional side view of an MEMS apparatus 200 according to the disclosure. In some implementations, the depiction of FIG. 2 can correspond or be similar to a cross section of the MEMS apparatus 100 of FIG. 1 along an x-z plane at the level of the comb drives 8A and 8B. The MEMS apparatus 200 can have a rotor 10, a left-hand stator 16A and a right-hand stator 16B, the function and configuration of which may be similar to that described in association with FIG. 1.

The left-hand stator 16A and the right-hand stator 16B can be of similar design, and so reference is made only to the left-hand stator 16A below. The left-hand stator 16A can be constructed from a layer stack consisting of an upper device layer 20 and a lower device layer 22, which can be electrically insulated from one another. Each of the device layers 20 and 22 can be produced from a semiconductor material, such as silicon. In some implementations, the upper device layer 20 can comprise polycrystalline silicon and the lower device layer 22 can comprise monocrystalline silicon. In some implementations, the device layers 20 and 22 can have an electrically insulating layer (not shown) arranged between them. In some implementations, this insulation layer can be produced from an oxide, as a result of which a silicon/oxide/silicon layer stack is obtained. In addition, there can additionally be a seed layer (not shown) between the device layers 20 and 22, depending on the production technique used. In some implementations, each of the device layers 20 and 22 can be produced from monocrystalline silicon. In some implementations, the two device layers can have been connected to one another by a bonding process, for example.

The rotor 10 can likewise be constructed from a layer stack having an upper device layer 24 and a lower device layer 26. In some implementations, the preceding remarks regarding the stators 16A and 16B can also apply to the rotor 10. In some implementations, as shown in FIG. 2, the upper device layer 24 may have been removed at the locations overlapping the stators 16A and 16B, for example using an etching process. When a voltage is applied to the rotor 10 and the stators 16A and 16B, the entire lower device layer 26 of the rotor 10 can be at the same electrical potential. A capacitance formed between the respective stator and the rotor 10 can be dependent on (e.g., proportional to) an area of overlap between the upper device layer 20 of the respective stator and the lower device layer 26 of the rotor 10. The respective capacitance can therefore be dependent on an angle Φ between these layers. The angle Φ can correspond in this instance to a torsion angle Φ of the mirror body 2 of the MEMS apparatus 200.

Figure 3:
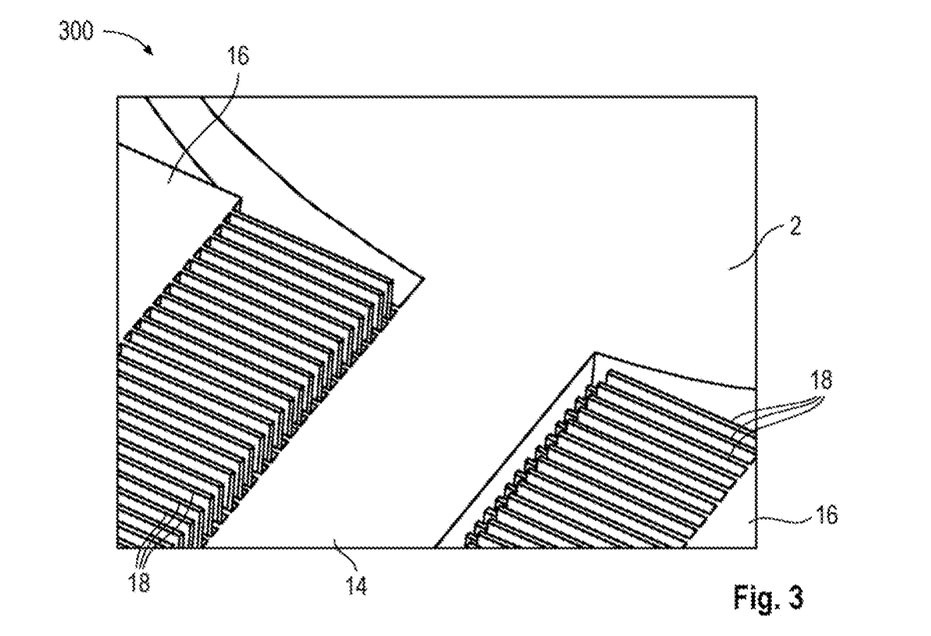
FIG. 3 shows a schematic perspective view of an MEMS apparatus according to the disclosure.

In some implementations, the MEMS apparatus 300 of FIG. 3 can be at least partially similar to the MEMS apparatuses in the figures described previously and can have identical components. From the perspective view of FIG. 3, it can once again be seen that specific sections of the upper device layer 24 of the rotor 10 are not present or have been removed, as has already been described in connection with FIG. 2.

Figure 4:
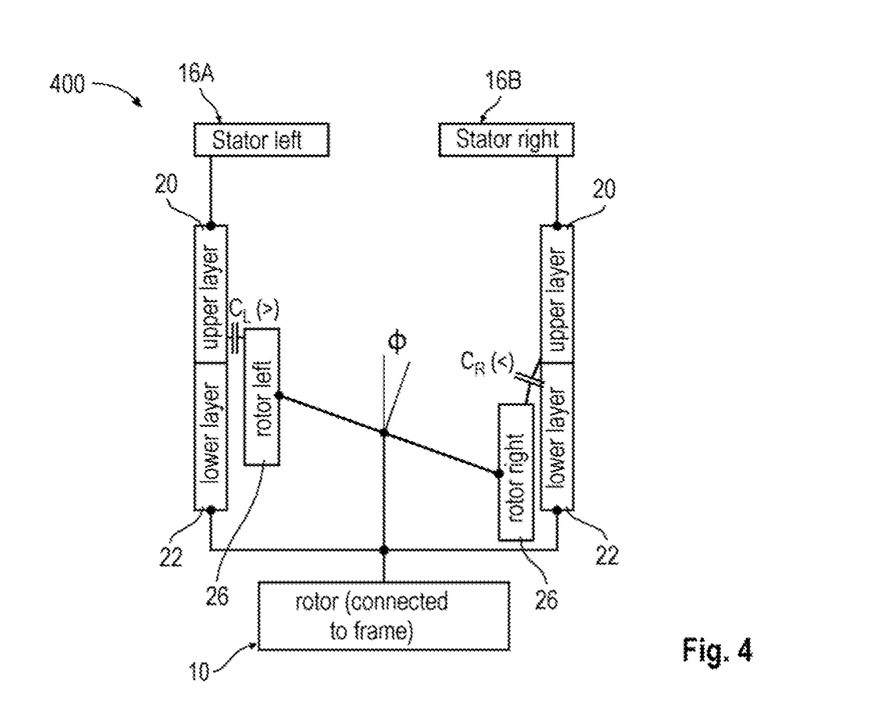
FIG. 4 schematically shows an MEMS apparatus according to the disclosure.

The MEMS apparatus 400 of FIG. 4 is shown in a schematic view. The components of the MEMS apparatus 400 (stator, rotor and associated device layers) have already been described in connection with the preceding figures. In some implementations, as shown in FIG. 4, the rotor 10, or its device layer 26, can be twisted through a torsion angle Φ relative to the stators 16A and 16B. As a result of this twisting, a capacitance $C_L$ can be formed between the upper device layer 20 of the left-hand stator 16A and the left-hand part of the rotor, or the left-hand part of its lower device layer 26. Analogously, a capacitance $C_R$ can be formed between the upper device layer 20 of the right-hand stator 16B and the right-hand part of the rotor, or the right-hand part of its lower device layer 26.

Figure 5:
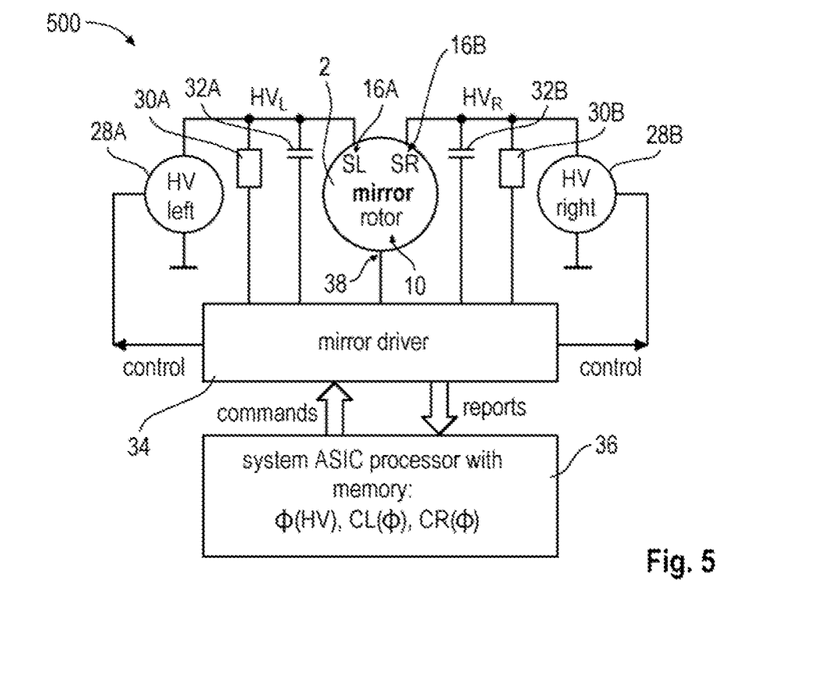
FIG. 5 schematically shows an MEMS apparatus according to the disclosure.

The MEMS apparatus 500 of FIG. 5 is shown in a schematic view. Besides the components already described in connection with the preceding figures, the MEMS apparatus 500 can have additional components for determining and controlling a torsion angle of the mirror body 2. The MEMS apparatus 500 can have a mirror body 2, a left-hand stator 16A (cf. SL), a right-hand stator 16B (cf. SR) and a rotor 10, as have already been described in connection with the preceding figures. In addition, the MEMS apparatus 500 can have a left-hand voltage source 28A (cf. HV, "high voltage"), a right-hand voltage source 28B, a left-hand electrical resistor 30A, a right-hand electrical resistor 30B, a left-hand capacitor 32A, a right-hand capacitor 32B, a mirror driver 34 and a processor 36 with memory (not shown). The components can be connected up to one another in the manner shown in FIG. 5, for example.

A (high) voltage $HV_L$ can be applied between a ground potential and the left-hand stator 16A, or the upper device layer thereof, by way of the left-hand voltage source 28A. The left-hand voltage source 28A can be a high-voltage bipolar transistor, for example. In the case of a resonantly operated MEMS apparatus, the voltage $HV_L$ can assume a value of less than approximately 100 V, whereas in the case of a quasi-statically operated MEMS apparatus, a voltage value in a range from approximately 200 V to approximately 300 V can be present. Analogously, a (high) voltage $HV_R$ can be applied between a ground potential and the right-hand stator 16A, or the upper device layer thereof, by way of the right-hand voltage source 28B.

The left-hand electrical resistor 30A can be used to measure the left-hand voltage $HV_L$, a value of the electrical resistor 30A being able to be in a MΩ range. The electrical resistor 30A can be connected to the input of a transimpedance amplifier (not shown) of the mirror driver 36. The right-hand electrical resistor 30B can be similar to the left-hand resistor 30A and can have similar functions. The left-hand capacitor 32A can be configured to keep a control loop stable, the control loop being described later on in connection with FIG. 8. A capacitance value of the capacitor 32A can be in a pF range. The right-hand capacitor 32B can be similar to the left-hand capacitor 32A and can have similar functions.

The mirror driver 34 can be configured to control the voltage sources 28A, 28B, so as thereby to be able to supervise the voltages $HV_L$ and $HV_R$ applied to the comb drives. Furthermore, the mirror driver 34 can be configured to receive from the processor 36 commands for controlling the voltage sources 28A, 28B and to send reports to the processor 36. The mirror driver 34 can be electrically connected to a measurement output (or measurement node) for determining a measurement signal at the rotor 10. The measurement output can be embodied in the form of a rotor pin 38 of the rotor 10, for example. The mirror driver 34, or components contained therein, can detect a measurement signal by way of the rotor pin 38, the measurement signal being able to be reported to the processor 36. In some implementations, the measurement signal can be a voltage (e.g., in the case of high-impedance measurement) or an electric current (e.g., in the case of low-impedance measurement). The rotor pin 38 can be arranged on a frame of the MEMS apparatus 500, for example, and insulated from a ground potential in order to prevent the current to be measured from draining.

The processor 36 can be embodied in the form of an ASIC (Application Specific Integrated Circuit) circuit, or can comprise such a circuit, for example. The processor 36 can send commands to the mirror driver 34 and, on the basis thereof, can use the latter to set the voltages $HV_L$ and $HV_R$ across the comb drives. Since the torsion angle Φ of the mirror body 2 can be dependent on the difference $HV_R - HV_L$, the processor 36 can be configured, by way of the mirror driver 34, to control and set the torsion angle Φ of the mirror body 2. In some implementations, a dependency of the torsion angle Φ on the voltage difference $HV_R - HV_L$ can be nonlinear. In the event of a change in the torsion angle Φ, the associated rotational movement of the mirror body 2 can be detected by way of the current measured on the rotor pin 38. Logic (e.g. in the form of software) implemented in the processor 36 can take the current measured on the rotor pin 38 as a basis for performing control or correction of the voltages $HV_R$ and $HV_L$. By way of example, in the case of a quasi-statically operated MEMS apparatus, the voltages $HV_R$, $HV_L$ can have any suitable form in order to set a new torsion angle Φ as quickly as possible and to actively slow the movement of the mirror body 2 and prevent or damp mechanical vibrations by virtue of the movement of the mirror body 2 being monitored and appropriate reactions taking place. To control the torsion angle Φ, the memory of the processor 36 can store one or more maps. In FIG. 5, the following maps, for example, can be lodged in the memory: Φ(HV), $C_L(Φ)$, $C_R(Φ)$.

Figure 6:
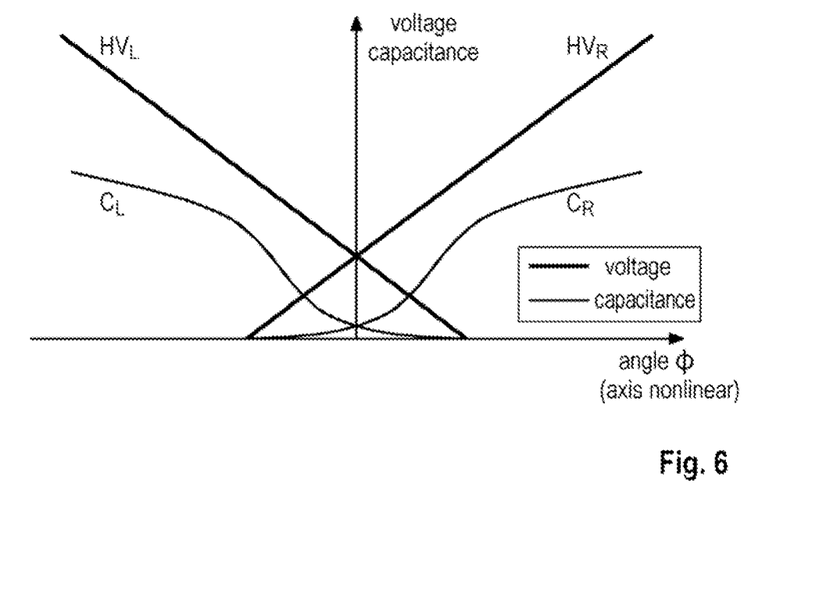
FIG. 6 shows voltage characteristics and capacitance characteristics based on a torsion angle of a mirror body of an MEMS apparatus according to the disclosure.

In FIG. 6, illustrative characteristics of the voltages $HV_R$ and $HV_L$ are plotted against a torsion angle Φ of the mirror body 2. Furthermore, FIG. 6 shows illustrative characteristics of the capacitances $C_L$ and $C_R$ as a function of the torsion angle Φ. In some implementations, the scaling of the torsion angle axis in FIG. 6 can be nonlinear. The depicted angles can be in a range from approximately −15 degrees to approximately +15 degrees, for example.

As shown in FIG. 6, the capacitance values in the depicted range may rise with increasing torsion angle Φ. In some implementations, the values of the capacitances $C_L$ and $C_R$ can be substantially at maximum at the maximum values of the torsion angle Φ of approximately −15 degrees and +15 degrees. At even higher values of the torsion angle Φ (not shown), the values of the capacitances $C_L$ and $C_R$ can drop again. In some implementations, arbitrarily high voltages can be used to approach the maximum capacitance values, but not to reach them completely, since excessive voltages can result in electrical flashovers arising in the air between the device layers of the capacitor. These electrical flashovers can result from the small dimensions of the air gap of a few micrometers, on the one hand, and the applied voltages of up to several hundred volts, on the other.

Figure 7:
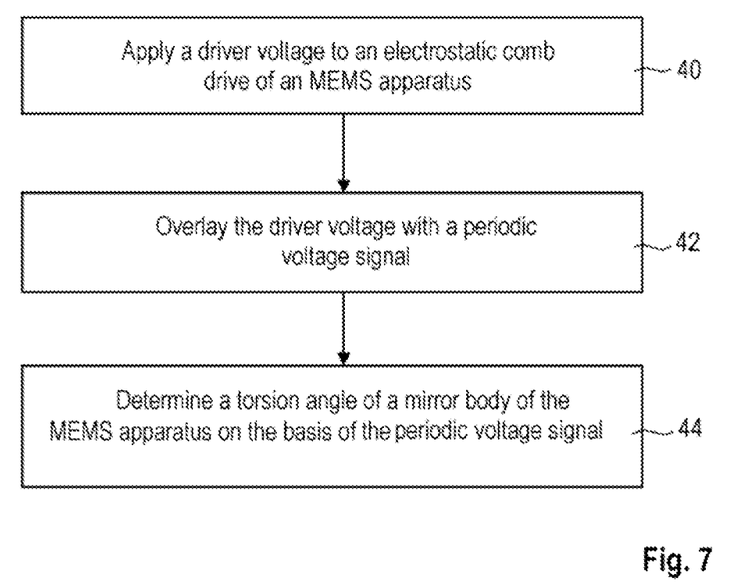
FIG. 7 shows a flowchart for a method according to the disclosure.

FIG. 7 shows a method for determining and controlling a torsion angle of a mirror body of an MEMS apparatus according to the disclosure. The method of FIG. 7 is depicted in a general way in order to qualitatively describe aspects of the disclosure. The method can have further aspects that are not shown and described in FIG. 7 for the sake of simplicity. By way of example, the method can be extended by one or more of the aspects explained in conjunction with other implementations described herein.

At 40, a driver voltage can be applied to an electrostatic comb drive of an MEMS apparatus. At 42, the driver voltage can be overlaid with a periodic voltage signal. At 44, a torsion angle of a mirror body of the MEMS apparatus can be determined based on the periodic voltage signal.

Figure 8:
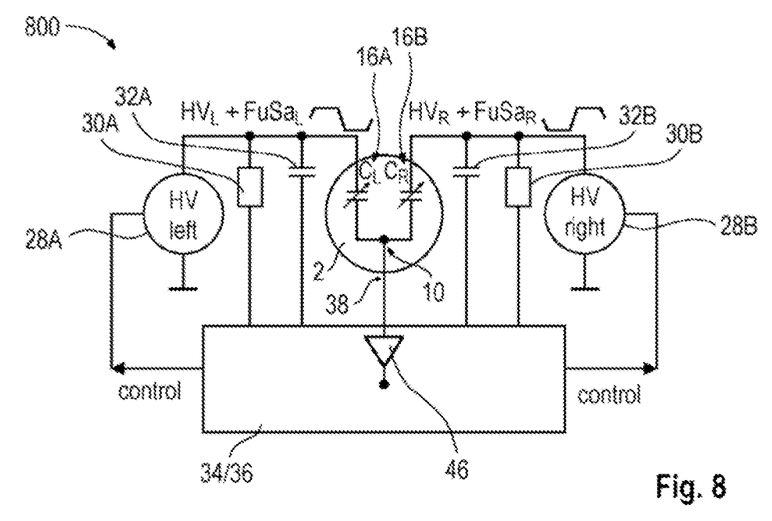
FIG. 8 schematically shows an MEMS apparatus according to the disclosure.

The method of FIG. 7 can be performed for example using the MEMS apparatus 800 shown schematically in FIG. 8. The MEMS apparatus 800 can be at least partially similar to the MEMS apparatus 500 of FIG. 5 and can have similar components. The method actions described below that are performed by the MEMS apparatus 800 can be regarded as a more detailed version of the method of FIG. 7.

In the implementation shown in FIG. 8, in one method action, the left-hand stator 16A can have a first driver voltage $HV_L$ applied to it, which can be overlaid with a first periodic voltage signal $FuSa_L$. In other words, the left-hand stator 16A can have a voltage $HV_L+FuSa_L$ across it. Analogously, the right-hand stator 16B can have a second driver voltage $HV_R$ applied to it, which can be overlaid with a second periodic voltage signal $FuSa_R$, as a result of which the right-hand stator 16B can ultimately have a voltage $HV_R+FuSa_R$ across it. An overlay of the driver voltages with the periodic voltage signals can be provided, for example, by the mirror driver 34 and/or the processor 36 by way of commands.

In some implementations, the periodic voltage signals $FuSa_L$ and $FuSa_R$ can be substantially in anti-phase. Furthermore, the frequencies of the periodic voltage signals $FuSa_L$ and $FuSa_R$ can be higher in each case than a resonant frequency of the MEMS apparatus 800 or of the mirror body 2. In some implementations, the frequencies of the periodic voltage signals $FuSa_L$ and $FuSa_R$ can be in a range from approximately 1 MHz to approximately 100 MHz, more precisely in a range from approximately 10 MHz to approximately 100 MHz, in each case. The amplitudes of the periodic voltage signals $FuSa_L$ and $FuSa_R$ can be in a range from approximately 0.1 V to approximately 1 V in each case. The amplitudes should not exceed a specific limit value, as a result of which it is possible to avoid infringing any EMC (electromagnetic compatibility) regulations.

The voltage signals $FuSa_L$ and $FuSa_R$ can have an arbitrary periodic characteristic. By way of example, the periodic voltage signals can be AC (alternating current) signals. In some implementations, the voltage signals $FuSa_L$ and $FuSa_R$ can have a dV/dt component with as even a temporal distribution as possible, since the component can cause a measurable electric current to be provided on the rotor pin 38. The periodic voltage signals $FuSa_L$ and $FuSa_R$ can have a triangular characteristic, which can result in a square current characteristic for the measurable electric current on the rotor pin 38. In some implementations, the characteristic of the periodic voltage signals can correspond to a sinusoidal characteristic, or can approach such a characteristic. In a first example, the periodic voltage signals can comprise noise-like pseudorandom signals, or can correspond to such signals, in order to transmit no discrete frequencies. In that case, a demodulation can be provided using correlation. In a further example, the periodic voltage signals can comprise frequency-spread signals.

In a further method action, the torsion angle Φ of the mirror body 2 of the MEMS apparatus 800 can be determined based on the periodic voltage signals $FuSa_L$ and $FuSa_R$. In some implementations, a measurement signal that can be based on the periodic voltage signals $FuSa_L$ and $FuSa_R$ can be determined at the rotor pin 38. The measurement signal can be, for example, an electric current detected at the rotor pin 38 or a voltage detected at the rotor pin 38. In some implementations, as shown in FIG. 8, the rotor pin 38 can have a transimpedance amplifier 46 connected downstream of the rotor pin 38. The capacitances $C_L$ and $C_R$ dependent on the torsion angle Φ can form a capacitive voltage divider for the periodic voltage signals $FuSa_L$ and $FuSa_R$. The measurement signal can therefore be based in particular on a quotient $$\frac{FuSa_L}{FuSa_R}$$

of the periodic voltage signals.

In a further method action, the measurement signal measured on the rotor pin 38 can be mapped to the torsion angle Φ. A map used for this purpose can be stored in a memory, for example, which can be part of the mirror driver 34 and/or of the processor 36. The map can provide an association between measurement signals at the rotor 10 and torsion angles 1, e.g. every detected measurement signal can be assigned the applicable currently existing torsion angle Φ by the map. The map stored in the memory can be a map that is individually coordinated for the MEMS apparatus 800. In some implementations, the stored map can be generated during a calibration of the MEMS apparatus 800, for example. Application of the map or determination of the torsion angle Φ based on the periodic voltage signals can be provided by the mirror driver 34 and/or the processor 36.

In some implementations, the torsion angle Φ can be determined by way of a direct measurement method. In some implementations, the periodic voltage signals $FuSa_L$ and $FuSa_R$ can have substantially the same amplitude, and the condition $$U_F \sim U_{FuSa} \cdot (C_L - C_R) \tag{1}$$

can be satisfied. Here, $U_F$ is the measurement signal detected at the rotor 10, $C_L$ is the capacitance between the left-hand stator 16A and the rotor 10, $C_R$ is the capacitance between the right-hand stator 16B and the rotor 10, and $U_{FuSa}$ is the amplitude of the periodic voltage signals $FuSa_L$ and $FuSa_R$.

In some implementations, the torsion angle Φ can be determined by way of an indirect measurement method. In some implementations, the amplitudes of the periodic voltage signals $FuSa_L$ and $FuSa_R$ can be regulated such that the condition $$FuSa_L \cdot C_L + FuSa_R \cdot C_R = 0 \tag{2}$$

can be satisfied. Here, $FuSa_L$ is the first periodic voltage signal, $FuSa_R$ is the second periodic voltage signal, $C_L$ is the capacitance between the left-hand stator 16A and the rotor 10, and $C_R$ is the capacitance between the right-hand stator 16B and the rotor 10.

This indirect measurement method can be based on a control loop, wherein the periodic voltage signals $FuSa_L$ and $FuSa_R$ can be adapted or controlled, as a result of which condition (2) remains satisfied. In some implementations, the amplitudes of the periodic voltage signals $FuSa_L$ and $FuSa_R$ can be controlled such that the measurement signal detected on the rotor pin 38 is zero. This can have the effect that the controller that detects the current on the rotor pin 38, in order to speed up angle changes, cannot be influenced by the signal detected on the rotor pin 38. Another effect can be that when a transimpedance amplifier is used to measure an electric current on the rotor pin 38, the transimpedance can be higher and therefore the angle resolution may be improved. By way of example, the periodic voltage signals $FuSa_L$ and $FuSa_R$ can be coupled into the control loop via the capacitances 32A and 32B.

In some implementations, the MEMS apparatus 800 can have a resonantly operated mirror body 2. In some implementations, the driver voltages $HV_L$ and $HV_R$ can be AC voltages and the torsion angle Φ can be detected substantially continuously using the described method. In some implementations, the MEMS apparatus 800 can have a quasi-statically operated mirror body 2. In some implementations, the driver voltages $HV_L$ and $HV_R$ can each be a controllable DC voltage and the quasistatic torsion angle $\Phi$ can be detected using the described method.

In a further method action, the torsion angle $\Phi$ of the mirror body 2 can be detected and verified before electromagnetic radiation is reflected by the mirror body 2. As a result, it is possible to check and ensure that the mirror body 2 has actually twisted through the set torsion angle $\Phi$, e.g. the electromagnetic radiation is reflected by the mirror body 2 at the correct or desired angle. The reflection angle can thus be determined without an actual reflection of the electromagnetic radiation taking place, or before an actual reflection of the electromagnetic radiation takes place. It should be taken into account that the methods described herein also allow the torsion angle $\Phi$ to be detected and verified during reflection of electromagnetic radiation.

In conventional MEMS apparatuses, a check on the torsion angle of a mirror body can be effected using a monitoring system, for example using a camera. The monitoring system or the camera can measure the angle between the beam of light emitted by a light source and the beam of light reflected by the mirror body in a direction defined by the torsion angle thereof. In this instance, the monitoring system can monitor the torsion angle of the mirror body only after the light pulse has been emitted by the light source. The system cannot monitor the torsion angle of the mirror body before the light pulse has been emitted, however. As already mentioned above, by contrast, the MEMS apparatuses and associated methods described herein can accurately determine the torsion angle before the light pulses are emitted. Moreover, the precise detection and control of the torsion angle means that it is possible to provide functional safety of the respective MEMS apparatus or of the superordinate application (e.g. automotive applications).

In conventional MEMS apparatuses, the torsion angle of the mirror body can also be measured using piezoelectric resistors or magnets on the rotor. Furthermore, the reflection of a light source can be measured using a PSD (position sensing device). These conventional methods require considerable additional complexity for the production process for the mirror body or the MEMS apparatus. By contrast, such additional complexity can be avoided in the case of the MEMS apparatuses and associated methods described herein, e.g. inexpensive and precise detection and control of the torsion angle can be provided.

The method of FIG. 7 and the method described in connection with FIG. 8 can have additional method actions that, for the sake of simplicity, cannot all be specified in more detail. By way of example, the described methods can have further actions, based on which the described measurement of the torsion angle $\Phi$ can additionally be checked. In some implementations, correct operation of the apparatus shown in FIG. 8 can be checked by temporarily applying the periodic voltage signals $FuSa_L$ and $FuSa_R$ in phase, or one of the two signals can be temporarily masked out. The resulting measured AC signal should match the expected value according to the currently expected torsion angle $\Phi$ of the mirror body and the known values of $C_L$ and $C_R$ at this angle.

Figure 9:
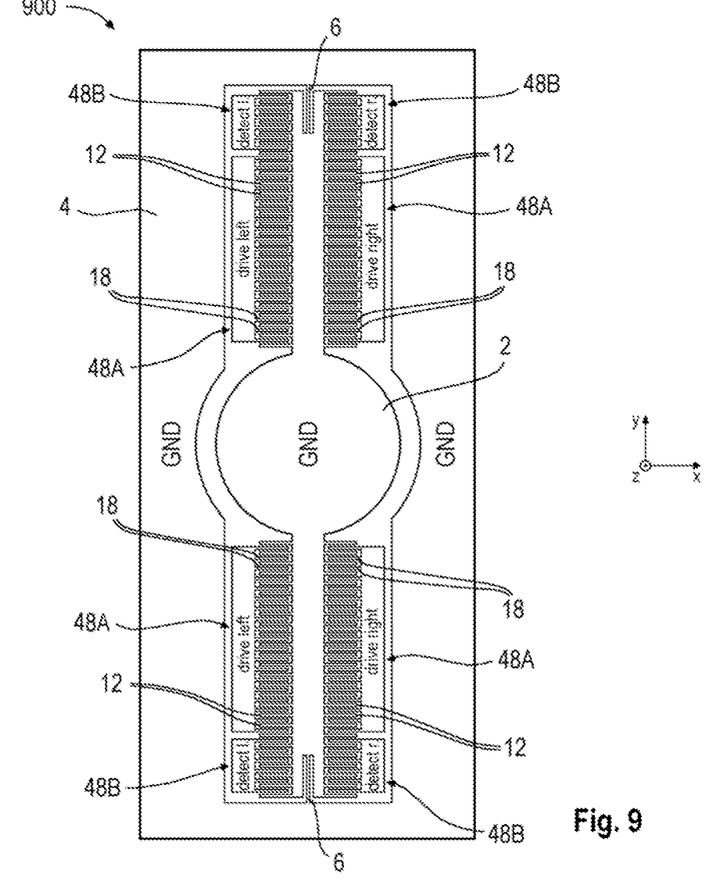
FIG. 9 shows a schematic plan view of an MEMS apparatus according to the disclosure.

The MEMS apparatus 900 of FIG. 9 can be at least partially similar to the MEMS apparatus 100 of FIG. 1. Analogously to FIG. 1, the MEMS apparatus 900 can have, by way of illustration, four combs (top left, top right, bottom left, bottom right) with rotor and stator. In some implementations, each of the four combs can be split into two sections. A first section 48A of the respective comb can be configured to bring about deflection of the mirror body 2 (cf. "drive left", "drive right"). In some implementations, the first comb section 48A can have the voltage HV, already discussed above, across it to drive the mirror body 2. The first section 48A of the comb can therefore be similar to the comb drive 8 of FIG. 1. A second section 48B of the respective comb can be configured to detect or measure the torsion angle of the mirror body 2 based on periodic voltage signals (cf. "detect left", "detect right"), as already discussed elsewhere herein. The driver voltage HV may not be across the second section 48B of the comb in this case. An illustrative interconnection of the two separate sections 48A, 48B of the combs, or their capacitances, is shown and discussed in FIG. 10.

Figure 10:
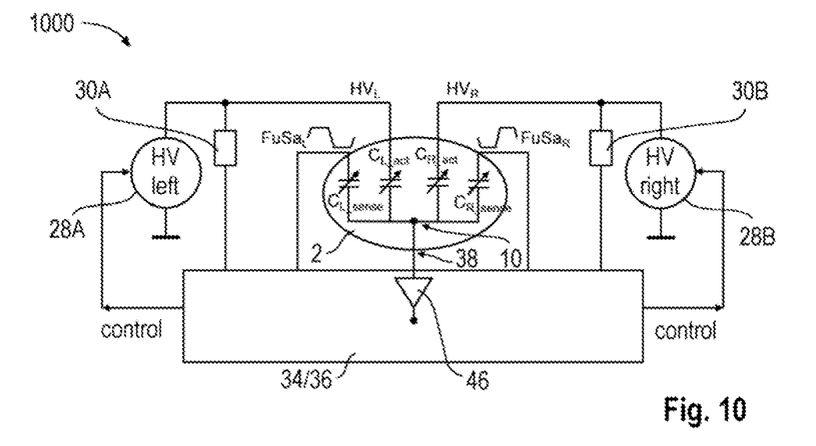
FIG. 10 schematically shows an MEMS apparatus according to the disclosure.

The MEMS apparatus 1000 of FIG. 10 can be at least partially similar to the MEMS apparatuses 500 and 800 of FIGS. 5 and 8. In some implementations, the MEMS apparatus 1000 can have four capacitances $C_{L\_act}$, $C_{R\_act}$, $C_{L\_sense}$ and $C_{R\_sense}$. In some implementations, the capacitance $C_{L\_act}$ can correspond to a first section 48A of a left-hand comb, the capacitance $C_{R\_act}$ can correspond to a first section 48A of a right-hand comb, the capacitance $C_{L\_sense}$ can correspond to a second section 48B of a left-hand comb and the capacitance $C_{R\_sense}$ can correspond to a second section 48B of a right-hand comb (cf. FIG. 9). In some implementations, the capacitances $C_{L\_act}$ and $C_{R\_act}$ can be similar to the capacitances $C_L$ and $C_R$ of FIG. 8.

The driver voltages $HV_L$ and $HV_R$ can be across the first section 48A of the left-hand comb and the first section 48A of the right-hand comb, in a way that has already been described in connection with FIGS. 5 and 8. In some implementations, the periodic voltage signals $FuSa_L$ and $FuSa_R$ can be across the second section 48B of the left-hand comb and the second section 48B of the right-hand comb. The separation of the driver voltages $HV_L$, $HV_R$ from the periodic voltage signals $FuSa_L$, $FuSa_R$ that is shown in FIG. 10 can provide the advantage of potential separation. As a result, the measurement of the torsion angle can take place directly in the low-voltage range, and the periodic voltage signals $FuSa_L$, $FuSa_R$ do not have to be capacitively coupled into the driver voltage HV.

In the examples described above, the mirror body can be configured to be rotatable about only one axis. In this context, detection and control of the torsion angle has been described by way of illustration using two driver voltages overlaid with two periodic voltage signals. It should be noted that the concepts described herein can also be extended to MEMS apparatuses with mirror bodies that can be rotatable about more than one axis. Associated control and detection of multiple torsion angles can accordingly be based on additional comb drives, additional driver voltages and additional periodic voltage signals.

Aspects

Methods and apparatuses according to the disclosure are explained below with reference to examples.

Aspect 1 is a method, comprising: applying a driver voltage to an electrostatic comb drive of an MEMS apparatus; overlaying the driver voltage with a periodic voltage signal; and determining a torsion angle of a mirror body of the MEMS apparatus based on the periodic voltage signal.

Aspect 2 is a method according to aspect 1, wherein the application of the driver voltage to the electrostatic comb drive comprises: applying a first driver voltage to a first stator of the comb drive; and applying a second driver voltage to a second stator of the comb drive.

Aspect 3 is a method according to aspect 2, wherein the overlaying of the driver voltage with a periodic voltage signal comprises: overlaying the first driver voltage with a first periodic voltage signal; and overlaying the second driver voltage with a second periodic voltage signal.

Aspect 4 is a method according to aspect 3, wherein the first periodic voltage signal and the second periodic voltage signal are substantially in anti-phase.

Aspect 5 is a method according to aspect 3 or 4, wherein the frequencies of the first periodic voltage signal and the second periodic voltage signal are higher in each case than a resonant frequency of the MEMS apparatus.

Aspect 6 is a method according to one of aspects 3 to 5, wherein the frequencies of the first periodic voltage signal and the second periodic voltage signal are in a range from 1 MHz to 100 MHz in each case.

Aspect 7 is a method according to one of aspects 3 to 6, wherein the amplitudes of the first periodic voltage signal and the second periodic voltage signal are in a range from 0.1 V to 1 V in each case.

Aspect 8 is a method according to one of aspects 3 to 7, further comprising: determining a measurement signal at a rotor of the comb drive, wherein the measurement signal is based on the first periodic voltage signal and the second periodic voltage signal.

Aspect 9 is a method according to aspect 8, wherein the determination of the torsion angle comprises: mapping the measurement signal to the torsion angle based on a stored map between measurement signals at the rotor of the comb drive and torsion angles.

Aspect 10 is a method according to aspect 9, further comprising: generating the stored map during a calibration of the MEMS apparatus.

Aspect 11 is a method according to one of aspects 8 to 10, wherein the measurement signal is based on a quotient $$\frac{FuSa_L}{FuSa_R},$$

where: $FuSa_L$ is the first periodic voltage signal, and $FuSa_R$ is the second periodic voltage signal.

Aspect 12 is a method according to one of aspects 8 to 11, wherein the first periodic voltage signal and the second periodic voltage signal have substantially the same amplitude, and the condition $U_F \sim U_{FuSa} \cdot (C_L - C_R)$ is satisfied, where: $U_F$ is the measurement signal, $C_L$ is a first capacitance between the first stator and the rotor, $C_R$ is a second capacitance between the second stator and the rotor, and $U_{FuSa}$ is the amplitude of the periodic voltage signals.

Aspect 13 is a method according to one of aspects 8 to 11, further comprising: regulating the amplitudes of the periodic voltage signals, so that the condition $FuSa_L \cdot C_L + FuSa_R \cdot C_R = 0$ is satisfied, where: $FuSa_L$ is the first periodic voltage signal, $FuSa_R$ is the second periodic voltage signal, $C_L$ is a first capacitance between the first stator and the rotor, and $C_R$ is a second capacitance between the second stator and the rotor.

Aspect 14 is a method according to one of the preceding aspects, wherein the driver voltage is an AC voltage and the mirror body is a resonantly operated mirror body.

Aspect 15 is a method according to one of the preceding aspects, wherein the driver voltage is a controllable DC voltage and the mirror body is a quasi-statically operated mirror body.

Aspect 16 is a method according to one of aspects 3 to 15, wherein the first periodic voltage signal and the second periodic voltage signal comprise noise-like pseudorandom signals.

Aspect 17 is a method according to one of aspects 3 to 16, wherein the first periodic voltage signal and the second periodic voltage signal comprise frequency-spread signals.

Aspect 18 is a method according to one of the preceding aspects, further comprising: verifying the torsion angle of the mirror body before electromagnetic radiation is reflected by the mirror body.

Aspect 19 is an MEMS apparatus, comprising: a mirror body; one or more electrostatic comb drives for twisting the mirror body based on one or more driver voltages; a unit for overlaying the one or more driver voltages with one or more periodic voltage signals; and a unit for determining a torsion angle of the mirror body based on the one or more periodic voltage signals.

Aspect 20 is an MEMS apparatus according to aspect 19, further comprising: a measurement output for determining a measurement signal at a rotor of the one or more comb drives, wherein the measurement signal is based on the one or more periodic voltage signals.

Aspect 21 is an MEMS apparatus according to aspect 20, further comprising: a memory for providing a map between the measurement signal and the torsion angle.

Although specific implementations have been depicted and described herein, it is clear to a person skilled in the art that a multiplicity of alternative and/or equivalent implementations can replace the specific implementations shown and described, without departing from the scope of the present disclosure. This application is intended to cover all adaptations or variations of the specific implementations discussed herein. Therefore, the intention is for this disclosure to be restricted only by the claims and the equivalents thereof.

The invention claimed is:

1. A method, comprising:
    applying one or more driver voltages to one or more electrostatic comb drives of an MEMS apparatus, based on:
        applying a first driver voltage to a first stator of the comb drive; and
        applying a second driver voltage to a second stator of the comb drive;
    overlaying the one or more driver voltages with one or more periodic voltage signals, based on:
        overlaying the first driver voltage with a first periodic voltage signal; and
        overlaying the second driver voltage with a second periodic voltage signal;
    determining a measurement signal at a rotor of the one or more comb drives, wherein the measurement signal is based on the first periodic voltage signal and the second periodic voltage signal; and
    determining a torsion angle of a mirror body of the MEMS apparatus based on the one or more periodic voltage signals.

2. The method as claimed in claim 1, wherein the first periodic voltage signal and the second periodic voltage signal are substantially in anti-phase.

3. The method as claimed in claim 1, wherein a frequency of the first periodic voltage signal and a frequency of the second periodic voltage signal are higher than a resonant frequency of the MEMS apparatus.

4. The method as claimed in claim 1, wherein a frequency of the first periodic voltage signal and a frequency of the second periodic voltage signal are in a range from 1 MHz to 100 MHz.

5. The method as claimed in claim 1, wherein an amplitude of the first periodic voltage signal and an amplitude of the second periodic voltage signal are in a range from 0.1 V to 1 V.

6. The method as claimed in claim 1, wherein determining the torsion angle comprises:
   mapping the measurement signal to the torsion angle based on a mapping of measurement signals at the rotor of the comb drive and torsion angles.

7. The method as claimed in claim 6, further comprising: generating the mapping during a calibration of the MEMS apparatus.

8. The method as claimed in claim 1, wherein the measurement signal is based on a quotient $$\frac{FuSa_L}{FuSa_R},$$

where:
   $FuSa_L$ is the first periodic voltage signal, and
   $FuSa_R$ is the second periodic voltage signal.

9. The method as claimed in claim 1, wherein a amplitude of the first periodic voltage signal and is substantially the same as an amplitude of the second periodic voltage signal, and the condition $$U_F \sim U_{FuSa} \cdot (C_L - C_R)$$

is satisfied, where:
   $U_F$ is the measurement signal,
   $C_L$ is a first capacitance between the first stator and the rotor,
   $C_R$ is a second capacitance between the second stator and the rotor, and
   $U_{FuSa}$ is the amplitude of the first periodic voltage signal or the amplitude of the second periodic voltage signal.

10. The method as claimed in claim 1, further comprising:
   regulating an amplitude of the first periodic voltage signal and an amplitude of the second periodic voltage signal to cause the condition $$FuSa_L \cdot C_L + FuSa_R \cdot C_R = 0$$

to be satisfied, where:
   $FuSa_L$ is the amplitude of the first periodic voltage signal,
   $FuSa_R$ is the amplitude of the second periodic voltage signal,
   $C_L$ is a first capacitance between the first stator and the rotor, and
   $C_R$ is a second capacitance between the second stator and the rotor.

11. The method as claimed in claim 1, wherein the driver voltage is an AC voltage and the mirror body is a resonantly operated mirror body.

12. The method as claimed in claim 1, wherein the driver voltage is a controllable DC voltage and the mirror body is a quasi-statically operated mirror body.

13. The method as claimed in claim 1, wherein the first periodic voltage signal and the second periodic voltage signal comprise noise-like pseudorandom signals.

14. The method as claimed in claim 1, wherein the first periodic voltage signal and the second periodic voltage signal comprise frequency-spread signals.

15. The method as claimed in claim 1, further comprising:
   verifying the torsion angle of the mirror body before electromagnetic radiation is reflected by the mirror body.

16. An MEMS apparatus, comprising:
   a mirror body;
   one or more electrostatic comb drives for twisting the mirror body based on one or more driver voltages,
      wherein a first driver voltage is applied to a first stator of the comb drives, and
      wherein a second driver voltage is applied to a second stator of the comb drives;
   a unit for overlaying the one or more driver voltages with one or more periodic voltage signals,
      wherein the first driver voltage is overlaid with a first periodic voltage signal, and
      wherein the second driver voltage is overlaid with a second periodic voltage signal;
   a first unit for determining a measurement signal at a rotor of the one or more comb drives, wherein the measurement signal is based on the one or more periodic voltage signals; and
   a second unit for determining a torsion angle of the mirror body based on the one or more periodic voltage signals.

17. The MEMS apparatus as claimed in claim 16, further comprising:
   a memory storing a mapping between the measurement signal and the torsion angle.

18. The MEMS apparatus of claim 16, wherein the measurement signal is mapped to the torsion angle based on a mapping of measurement signals at the rotor of the comb drive and torsion angles.

19. The MEMS apparatus of claim 18, wherein the mapping is generated during calibration of the MEMS apparatus.

20. The MEMS apparatus of claim 16, wherein the first periodic voltage signal and the second periodic voltage signal are substantially in anti-phase.

21. The MEMS apparatus of claim 16, wherein a frequency of the first periodic voltage signal and a frequency of the second periodic voltage signal are higher than a resonant frequency of the MEMS apparatus.

* * * * *